(12) United States Patent
Shelsky et al.

(10) Patent No.: US 8,138,776 B2
(45) Date of Patent: Mar. 20, 2012

(54) IN-CIRCUIT TEST ASSEMBLY

(76) Inventors: Robert C. Shelsky, Nashua, NH (US);
Kenneth W. Graham, Plainville, MA (US); Dennis D. Everson, Banks, OR (US)

( * ) Notice: Subject to any disclaimer, the term of this patent is extended or adjusted under 35 U.S.C. 154(b) by 420 days.

(21) Appl. No.: 12/495,552

(22) Filed: Jun. 30, 2009

(65) Prior Publication Data

US 2010/0171508 A1 Jul. 8, 2010

Related U.S. Application Data

(60) Provisional application No. 61/102,461, filed on Oct. 3, 2008.

(51) Int. Cl.
*G01R 31/00* (2006.01)
*G01R 31/20* (2006.01)

(52) U.S. Cl. .................. 324/750.16; 324/754.08

(58) Field of Classification Search ............... None
See application file for complete search history.

(56) References Cited

U.S. PATENT DOCUMENTS

| | | | | |
|---|---|---|---|---|
| 4,912,401 A | * | 3/1990 | Nady et al. | 324/756.05 |
| 5,363,280 A | * | 11/1994 | Chobot et al. | 361/794 |
| 5,834,335 A | * | 11/1998 | Buschbom | 438/107 |
| 5,940,278 A | * | 8/1999 | Schumacher | 361/769 |
| 6,347,946 B1 | * | 2/2002 | Trobough et al. | 439/70 |
| 6,354,844 B1 | * | 3/2002 | Coico et al. | 439/66 |
| 6,639,154 B1 | * | 10/2003 | Cartier et al. | 174/255 |
| 6,836,138 B1 | * | 12/2004 | Park et al. | 324/756.05 |
| 7,212,395 B2 | * | 5/2007 | Li et al. | 361/306.1 |

* cited by examiner

*Primary Examiner* — Vinh Nguyen
(74) *Attorney, Agent, or Firm* — PatentForge

(57) ABSTRACT

A test assembly that may provide access to signals of a circuit that includes an integrated circuit. The test assembly may include structural members that limit movement of components relative to each other.

20 Claims, 3 Drawing Sheets

IN-CIRCUIT TEST ASSEMBLY

RELATED APPLICATIONS

This application claims priority to U.S. Provisional application Ser. No. 61/102,461 filed Oct. 3, 2008. and entitled "BGA In-Circuit Test Assembly" which is hereby incorporated by reference in its entirety for all purposes.

BACKGROUND

The present disclosure relates generally to assemblies for electronic testing and more specifically to test assemblies mounted on circuit boards used in monitoring integrated circuit signals.

Examples of assemblies for electronic testing are found in the following US Patents: U.S. Pat. No. 4,733,461; U.S. Pat. No. 5,151,039; U.S. Pat. No. 5,437,556; U.S. Pat. No. 5,575,686; U.S. Pat. No. 6,464,513 and U.S. Pat. No. 7,008,238. The disclosures of these references are hereby incorporated by reference in their entirety for all purposes.

SUMMARY

Integrated circuits operate using binary logic and transmit analog signals over lines that may incorporate pads, contacts, bond wires, traces and/or leads to other integrated circuits. Integrated circuits function at high speeds with multiple simultaneous and complex signals.

Integrated circuit functions are typically characterized by a logic analyzer which connects to the integrated circuit signal lines and simultaneously digitizes each analog signal at each signal line. The analyzer then statically displays the signals in a manner that allows the operator to see the functions and dependencies between the individual signals. Signal analysis may be done as the integrated circuit operates with other integrated circuits on a circuit board. Especially with integrated circuits that connect to the circuit board through a mounting configuration such as a ball grid array, it may not be possible to physically access the signal lines.

Alternatively, integrated circuit functions may be monitored using an oscilloscope. An oscilloscope may function similarly to provide a static display of a repeating waveform. The oscilloscope may use probes to contact portions of leads, traces or pads and may have similar difficulties in accessing a signal line.

Signal boards and sockets or connectors are often used to provide access to signal lines for analysis and to provide an easy way to change integrated circuits operating on the circuit board. Test assemblies mounted on a circuit board that are handled frequently have to resist forces exerted on the components that may damage interfaces. This disclosure will describe an assembly that provides access to integrated circuit signals while operating in conjunction with a circuit board. The assembly may include a socket and signal board. The assembly may further include a structural component to maintain orientation of the socket and signal board and mitigate forces applied to the assembly during handling to prevent damage.

The adapter or signal board may have an integrated circuit mounted on a top side of the board. The socket may be a ball grid array socket and the housing may extensions. The bottom side of the signal board may be configured to make electrical contact with the socket and may be mounted to the top of the socket. When the assembly is then mounted on a control board populated with other integrated circuits, the assembly may conduct signals between the integrated circuit and the control board.

The signal board may also comprise additional electrical contacts, signal lines and/or traces that provide an alternate path for the signals. The alternate signal routing may provide a connection to test equipment such as a logic analyzer. The signal board may make electrical contact to the socket through soldered connections such as solder balls which abut pads or solder balls which are reflowed to make an electrical contact to pads This specification may describe an interposer module configured to be assembled to and carry signals between a control board with a first array of contacts and an integrated circuit with a second array of contacts where the first array of contacts correspond in position to the second array of contacts. The interposer module may comprising a signal board including a first side with a third array of contacts configured to accept the second array of contacts a second side with a fourth array of contacts corresponding in position to the third array of contacts and a first set of discrete conductive paths connecting each contact on the third array of contacts to the corresponding contact of the fourth array of contacts.

The interposer module may further comprise a socket including a body with a first side and a second side, a set of discrete conductive means each with a proximal end and a distal end where on assembly each conductive means proximal end meets a contact of the first array of contacts and each conductive means distal end meets a contact of the fourth array of contacts. The interposer module may further comprise fasteners configured to prevent motion of the signal board in relation to the socket body.

This specification may in addition describe a digital signal test system comprising an integrated circuit with a first set of connection pads defining a contact configuration of positions in two dimensions, a primary board with a processor and a second set of connection pads in the contact configuration and an in-circuit test assembly disposed between the integrated circuit and the primary board. The in-circuit test assembly may include a lower portion with a set of discrete socket contacts in the contact configuration and an upper portion. The upper portion may include a first set of discrete signal paths in the contact configuration, a third set of connection pads with each pad proximate to an edge of the upper portion and a second set of discrete signal paths where each signal path is connected at a first end to one of the first set of signal paths and is connected at a second end to one of the third set of connection pads.

The in-circuit test assembly may further include retention means that passes through the upper portion and the lower portion configured to limit movement of the upper portion in relation to the lower portion and electrically insulated from the first set of discrete signal paths, the second set of discrete signal paths and the discrete socket contacts where the integrated circuit, the primary board and the in-circuit test assembly are aligned and configured to transmit signals between the integrated circuit and the primary board through the first set of discrete signal paths and the set of discrete socket contacts.

While the term electrical contact may be used in this description as an example for illustration, this term may encompass a soldered connection or a non-soldered connection between two electrically conducting faces in electrical contact and may be similarly described by the terms contacts, connection points and pads. A plurality of these connections may form a planar array or contact configuration specific to an integrated circuit packaging system such as a ball grid array that is standard in the industry and well known to those skilled in the arts. Similarly, for clarity an electrical contact of an array may be called out, described and referenced as a single contact while still remaining a component in an array or matrix of electrical contacts.

Signals may be conducted between these features by conductive means such as traces, signal lines or conductive paths. The test assembly may be mated to a circuit board with additional components and may be equivalent to a control board or primary board. In some configurations this may be a motherboard for a computer.

The term "discrete" may be used in relation to a set or array of units. For the purpose of this disclosure "discrete" may define each unit as being individual, separate and independently operating.

The term "corresponding" or "corresponding in position" may be used in reference to the position of two contacts, for example, on two sides of a circuit board. For the purpose of this disclosure this will mean the two contacts are on two parallel surfaces and a line orthogonal to the parallel surfaces that passes through a contact will also pass through the corresponding contact. Similarly, for a first array with a contact configuration defining the position of each contact, a second array disposed in the same contact configuration and corresponding in position to the first array on a parallel surface, orthogonal lines through each contact of the first array will pass through each corresponding contact of the second array.

DESCRIPTION

Figure 1:
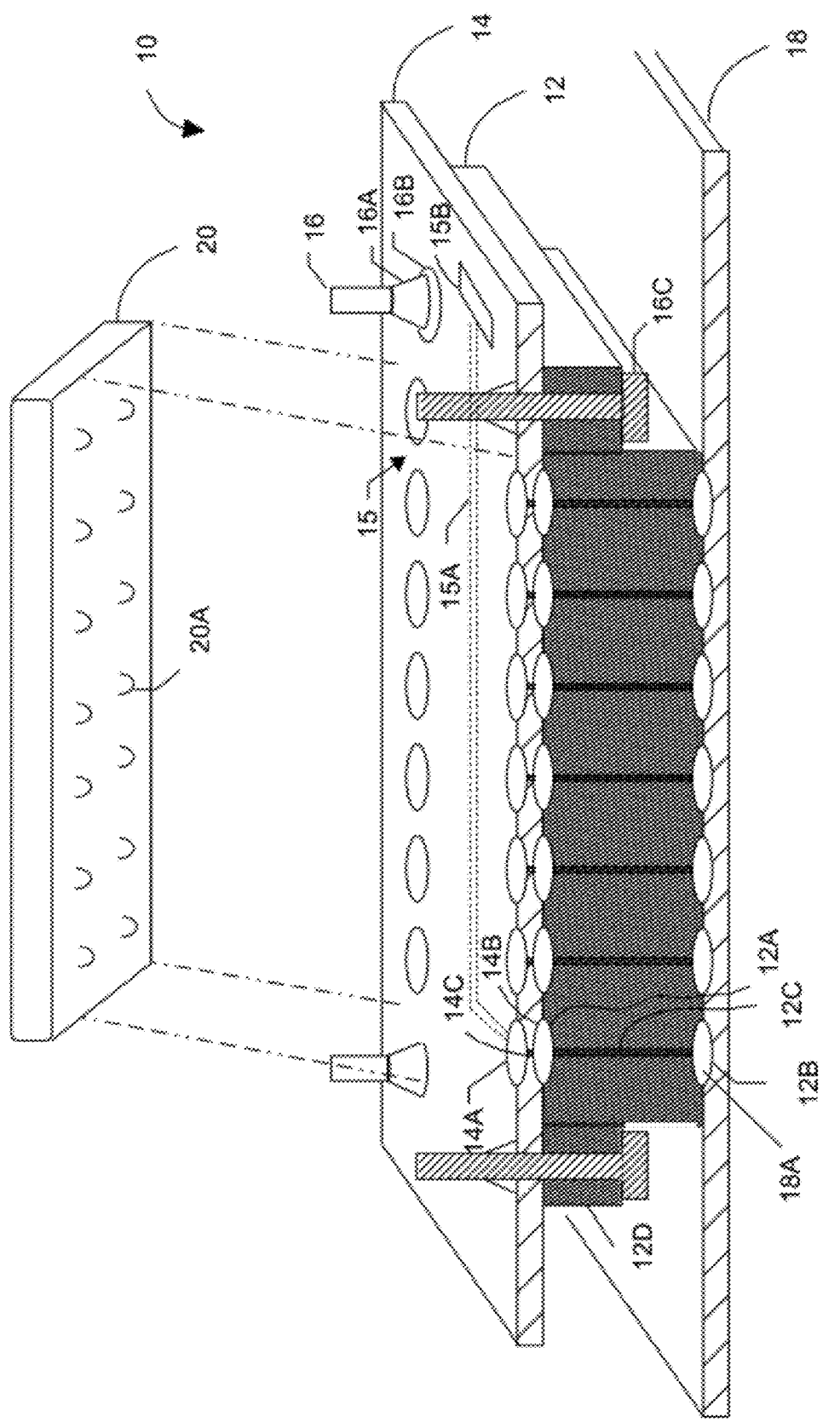
FIG. 1 is a cross section perspective view of a test assembly.

FIG. 1 is a cross section perspective view of an interposer module or test assembly 10. Test assembly 10 is shown including a socket or connector 12, a test board or signal board 14 and retention means or a fastener 16. Test assembly 10 is shown in conjunction with a primary or control board 18 and an integrated circuit 20. Control board 18 may include an electrical contact 18A to socket 12. Socket 12 may include a top electrical contact 12A to signal board 14, a bottom electrical contact 12B connected to control board 18 and a signal line or signal path 12C for transmitting signals between top electrical contact 12A and bottom electrical contact 12B supported by a socket body or housing 12D.

Signal board 14 may have a top electrical contact 14A, a bottom electrical contact 14B and a signal line or signal path 14C for transmitting signals between electrical contact 14A and electrical contact 14B. Integrated circuit 20 may include electrical contacts or solder balls 20A configured to connect to signal board top electrical contact 14A.

Electrical contacts 18A, 12A, 12B and 14B may not be separate and discrete features or components. For example, electrical contacts 18A and 12B may comprise a single electrical contact that connects socket 12 to control board 18. Electrical contacts 18A and 12B may instead be solder bumps or solder balls and pads that form an electrical contact by physical contact only. Alternatively, electrical contacts 18A and 12B may be solder balls and cups configured to make positive electrical contacts to the solder balls by physical contact only.

Signal board 14 may further include adjunct signal line 15 with adjunct signal trace 15A and adjunct pad 15B. Each corresponding contact pair of electrical contact arrays 14A and 14B may have a discrete adjunct signal trace 15A and adjunct pad 15B. Adjunct pad 15B may be positioned separate from contact arrays 14A or 14B and may be near the periphery or an edge of signal board 14. For the purposes of this application, the phrases "positioned separate" and "near an edge of signal board" may indicate adjunct pad 15B is not positioned under the package of integrated circuit 20 and is accessible. Assembled, adjunct pads 15B of test assembly 10 may be exposed or accessible allowing contact with a probe as may be used with a logic analyzer to access each discrete signal of integrated circuit 20.

Fastener 16 may be assembled to test assembly 10 such that it passes through socket body 12D and also passes through signal board 14. Fastener 16 may have a separate fastener portion 16A. Fastener 16 may have a proximal end and a distal end. Fastener 16 may be retained in test assembly 10 by a head 16C at a proximal end and may be further retained in test assembly 10 by a fastener portion 16A at a distal end.

Fastener portion 16A may be a solder joint between fastener 16 and a pad 16B on signal board 14. Fastener portion 16A may positively retain fastener 16 in position. Fastener 16 may limit movement of signal board 14 and socket 12 in relation to each other. While fastener 16 is shown as a pin with solder joint 16A in FIG. 1, any retention means which limits movement between socket 12 and signal board 14 is within the scope of this disclosure.

Fastener 16 may be an extension of socket body 12D and may be formed from the body material of socket 12. On assembling signal board 14 to socket 12, the part of socket body 12D forming pin 16 may protrude through signal board 14. Fastener 16 may be comprised of a thermoplastic or other moldable material. Assembling test assembly 10 may include melting and reforming a portion of fastener 16 to retain signal board 14 and prevent movement or disassembly of signal board 14 from socket 12.

Alternatively, fastener 16 may be a rivet or other retainer that passes through socket 12 and signal board 14 on assembly. A portion of fastener 16 may then be "upset" or deformed to form a head or retaining portion.

Alternatively, fastener 16 may be threaded and fastener portion 16A may be a nut screwed onto fastener 16 to hold signal board 14 in place.

Alternatively, fastener 16 may be unthreaded and a fastener portion 16A may comprise a radial retaining ring, push-on nut or self-locking ring that is pressed over fastener 16 to abut signal board 14.

Signal board 14 may further include a cable or flex circuit. The cable or flex circuit may carry signals from integrated circuit 20 to external equipment. The cable or flex circuit may be incorporated into assembly 10 so that assembly 10 provides strain relief on the cable or flex circuit.

Figure 2:
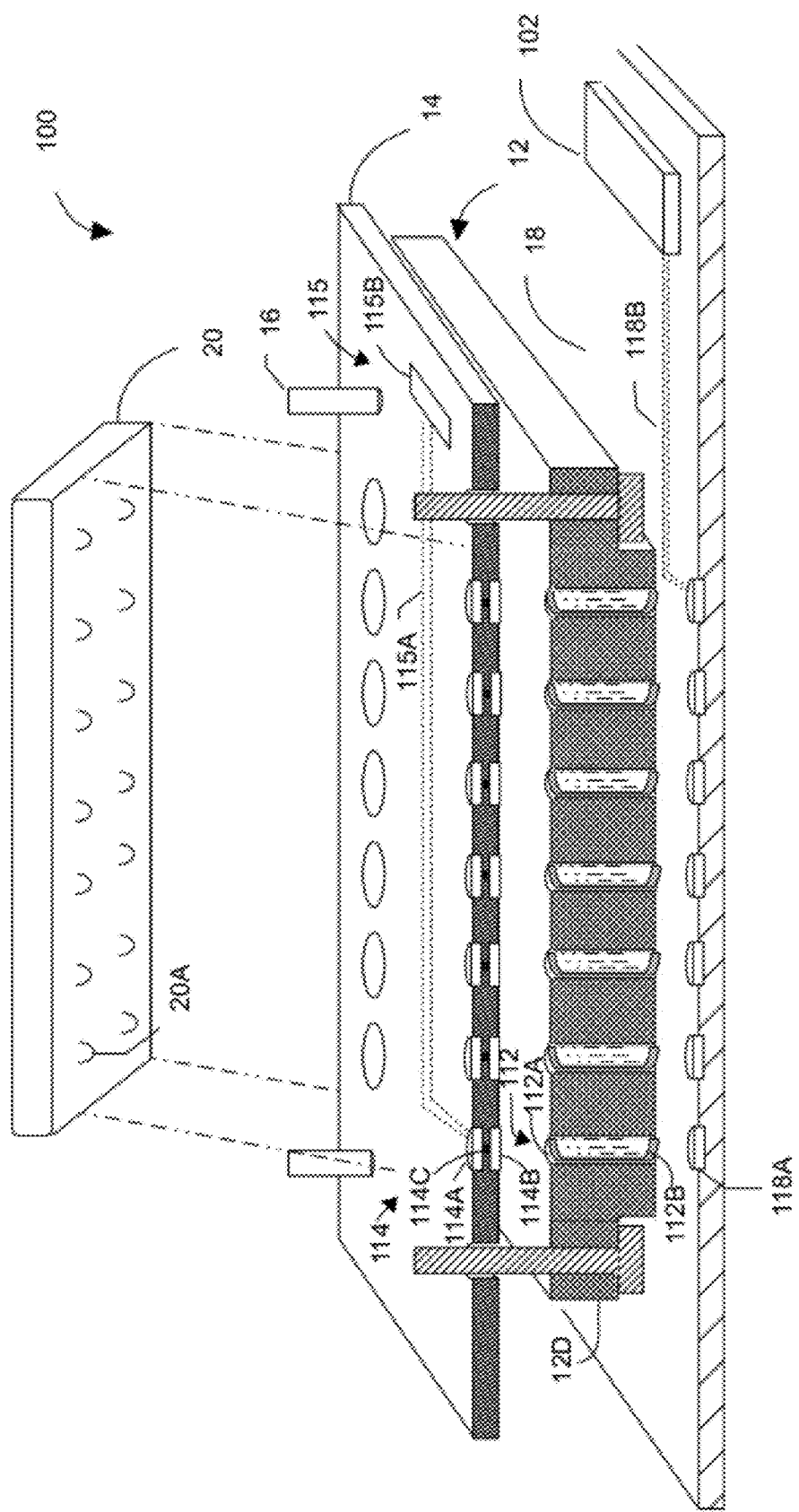
FIG. 2 is an exploded cross section perspective view of a test assembly.

FIG. 2 shows an exploded cross-section perspective view of an interposer module or test assembly 100 similar to test assembly 10. Similar numbering may be used here for features similar to features in the previous figure. Test assembly 100 again includes control board 18, socket 12, test board or signal board 14 and fastener 16. Test assembly 100 is shown in conjunction with control board 18 and integrated circuit 20 with electrical contact 20A.

Control board 18 may include a processor 102, an electrical contact 118A, and a signal line 118B connected to processor 102 and electrical contact 118A to transmit signals. Socket 12 may again include housing or body 12D supporting a conductive means, socket contact or conductive means array 112. Conductive means 112 may include a distal end 112A and a proximal end 112B.

Signal board 14 may include a contact structure or contact structure array 114. Contact structure 114 may include a top electrical contact 114A, a bottom electrical contact 114B and signal line 114C for transmitting signals between top electrical contact 114A and bottom electrical contact 114B.

Conductive means or socket contact 112 may be a spring type contact that flexes to exert a normal force when in contact with a mating surface. With test assembly 100 assembled, conductive means 112 may contact electrical contact 114B of signal board 14 at distal end 112A and may also contact electrical contact 118A of primary board 18 at proximal end 112B. While a 'c' shaped socket contact is illustrated here, any shape or configuration of socket contact may be used that exerts a contact force.

Integrated circuit 20 may be configured as a ball grid array package with an array of electrical contacts 20A that defines a two dimensional, planar geometric contact configuration of positions. Such integrated circuit packaging is well known to those skilled in the art. Some configurations may be referred to by the acronym FBGA or Fine Ball Grid Array but any configuration which includes solder balls in an array will fall within the scope of this disclosure. Packaging with 78, 86, 96 or any other contact count may be used. The contact array of the ball grid array package may be orthogonal with contacts on 0.8 millimeter centers but other array configurations may be used.

Each of connections 20A, 112A, 112B, 114A, 114B and contact structure 114 may each be considered an array of contacts conforming to the contact configuration of ball grid array electrical contacts 20A. When assembled, each of electrical contacts 112A, 112B, 114A and 114B, conductive means 112 and signal line 114C of test assembly 100 may be substantially vertically aligned and orthogonal to the surface of primary board 18. Assembled, test assembly 100 may be configured to transmit signals between processor 102 and integrated circuit 20.

Signal board 14 may further include an adjunct signal line 115. Adjunct signal line 115 may include adjunct trace 115A and adjunct pad 115B. Each contact structure 114 may be associated with an adjunct signal line 115 so as to provide probe access to each signal separately. Adjunct pad 115B may be positioned separate from contact structure array 114 and may be proximate or near an edge of signal board 14. With test assembly 100 assembled, adjunct pads 115B may be exposed to allow contact with a probe such as may be used with a logic analyzer.

Figure 3:
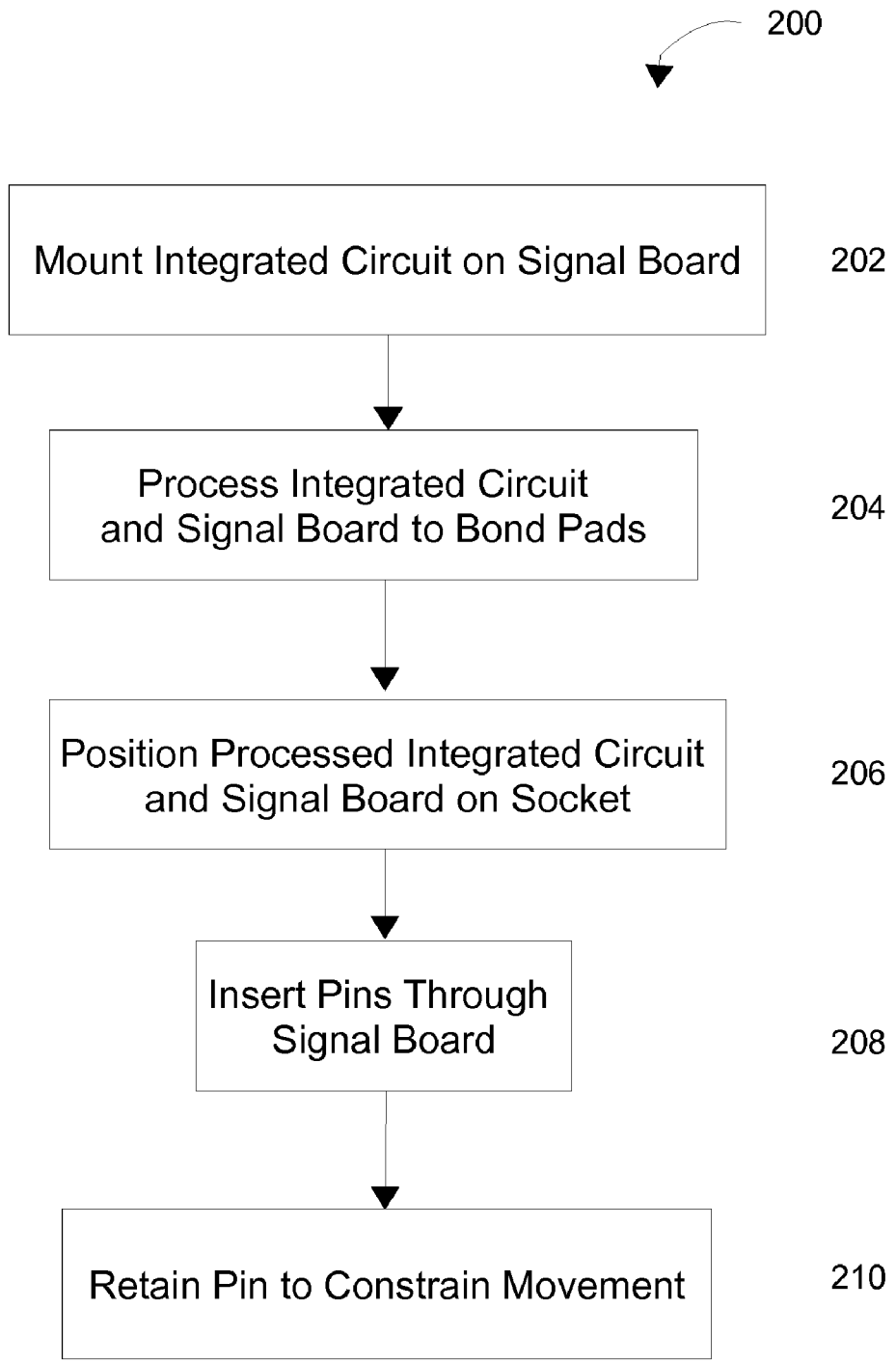
FIG. 3 is a flow chart detailing a method for assembling a test assembly.

FIG. 3 is a flow chart illustrating steps for assembling an interposer module or test assembly 200. In step 202 ball grid array packaged integrated circuit 20 is mounted on signal board 14. Signal board 14 may have top and bottom surfaces, an edge, arrays of pads on the top surface and bottom surface and signal lines disposed in an array pattern connecting corresponding pads on top and bottom surfaces. In step 204 the integrated circuit and signal board assembly may be processed to bond the ball grid array integrated circuit package to the signal board top surface pads. Processing may include heating the assembly to reflow solder between electrical contacts or pads to provide electrical continuity. In step 206 the processed integrated circuit and signal board assembly is positioned on socket 12 with socket contact array 112. In step 208 fasteners 16 are inserted through signal board 14 and socket housing 12D. In step 210 fasteners 16 are retained in place so as to constrain movement of signal board 14 in relation to socket 12. Retaining fasteners 16 in place may include soldering fasteners 16, mating threaded portions to fasteners 16, plastically deforming fasteners 16 or pushing on locking nuts or washers.

Alternatively, step 206 may include fasteners 16 as a portion of socket 12. Positioning the signal board assembly on socket 12 may result in fasteners 16 passing through signal board 14. Step 208 is then omitted from this method.

The described system and assemblies are examples and are not to be used as limitations. The number of pads and electrical contacts may be more or fewer than those shown. The sockets and boards may take on different configurations and shapes. Any suitable configuration or combination of components presented, or equivalents to them that perform a similar function, may also be used.

This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized.

Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

We claim:

1. An interposer module configured to be assembled to and carry signals between a control board with a first array of contacts and an integrated circuit with a second array of contacts where the first array of contacts correspond in position to the second array of contacts, the interposer module comprising:
  a signal board including:
    a first side with a third array of contacts configured to accept the second array of contacts;
    a second side with a fourth array of contacts corresponding in position to the third array of contacts; and
    a first set of discrete conductive paths connecting each contact on the third array of contacts to the corresponding contact of the fourth array of contacts; and
  a socket including:
    a body with a first side and a second side;
    a set of discrete conductive means each with a proximal end and a distal end where once assembled each conductive means proximal end meets a contact of the first array of contacts and each conductive means distal end meets a contact of the fourth array of contacts; and fasteners passing through only the signal board and socket configured to prevent motion of the signal board in relation to the socket body.

2. The interposer module of claim 1 where the fasteners are threaded and include fastener portions and when assembled the fastener portions have been screwed onto the fasteners.

3. The interposer module of claim 1 where the fasteners are solderable pins, and the signal board includes pads adjacent to the pin locations and assembly of the interposer includes soldering each pin to the adjacent pad.

4. The interposer module of claim 1 where when assembled a portion of each fastener has been plastically deformed.

5. The interposer module of claim 1 where the signal board further comprises a set of discrete adjunct conductive paths and a set of adjunct contacts on the first side positioned separately from the third array of contacts and the adjunct conductive paths carry signals between the third array of contacts and the adjunct contacts.

6. The interposer module of claim 1 where the fasteners are electrically insulated from the set of discrete conductive means.

7. The interposer module of claim 1 where assembly of the interposer module further includes solder reflow of at least a portion of the first array, the second array, the third array and the fourth array of contacts.

8. The interposer module of claim 1 where the second array of contacts consists of 78, 86 or 96 contacts.

9. A digital signal test system comprising:
an integrated circuit with a first set of connection pads defining a contact configuration of positions in two dimensions;
a primary board with a processor and a second set of connection pads in the contact configuration; and
an in-circuit test assembly disposed between the integrated circuit and the primary board including:
a lower portion with a set of discrete socket contacts in the contact configuration; and
an upper portion including:
a first set of discrete signal paths in the contact configuration where each discrete signal path includes a top pad and a bottom pad;
a set of probe pads with each pad proximate to an edge of the upper portion; and
a second set of discrete signal paths where each signal path is connected at a first end to one of the first set of signal paths and is connected at a second end to one of the set of probe pads proximate to the edge of the board; and
retention means that passes through and contacts only the upper portion and the lower portion and configured to maintain a frictional connection between each discrete socket contact and each of the corresponding first set of discrete signal paths where the retention means is electrically insulated from the first set of discrete signal paths, the second set of discrete signal paths and the discrete socket contacts,
where the integrated circuit, the primary board and the in-circuit test assembly are aligned and configured to transmit signals between the integrated circuit and the primary board through the first set of discrete signal paths and the set of discrete socket contacts.

10. The digital signal test system of claim 9 where the upper portion further includes a pad and the retention means is a pin with a proximal end and a distal end and is retained in the test assembly by a head at the proximal end and is retained at the distal end by a solder joint between the fastener and the upper portion pad.

11. The digital signal test system of claim 9 where the retention means is one selected from the set of: a rivet; a screw; a bolt and nut; and a pin and push-on nut.

12. The digital signal test system of claim 9 where the integrated circuit is packaged as a ball grid array which defines the contact configuration and the second set of connection pads, the first set of discrete signal paths and the socket contacts are each disposed in a configuration substantially identically to the contact configuration.

13. The digital signal test system of claim 9 where the integrated circuit first set of connection pads consist of 78, 86 or 96 connection pads in an orthogonal array on 0.8 millimeter centers.

14. A method of assembling an interposer module comprising:
mounting a ball grid array packaged integrated circuit on a signal board with:
a signal board top surface including a top array of pads;
a signal board bottom surface including a bottom array of pads;
edges defining the periphery of the signal board; and
a first set of discrete signal lines connecting corresponding pads of the top array of pads to the bottom array of pads,
where the top array of pads, the bottom array of pads and the first set of discrete signal lines are disposed in a pattern corresponding to the integrated circuit grid ball array;
processing the signal board and ball grid array integrated circuit to bond the signal board top surface array of pads to the ball grid array of the integrated circuit;
positioning the signal board with the ball grid array packaged integrated circuit on a socket including:
a housing with a top surface and a bottom surface;
an array of discrete socket contacts with distal ends at the socket housing top surface; and proximal ends at the socket housing bottom surface, where the socket contacts are disposed in a pattern corresponding to the integrated circuit ball grid array;
inserting a set of pins through and contacting only the signal board and the socket housing; and
retaining the set of pins in place to maintain an electrical connection between each discrete socket contact and each corresponding pad of the bottom array of pads of the signal board.

15. The method of assembling the interposer module of claim 14 where the signal board further includes a second set of discrete signal lines to carry signals from the first set of discrete signal lines to a set of pads proximate to the signal board edges.

16. The method of assembling the interposer module of claim 14 further comprising:
positioning the interposer module on a control board including an array of pads; and
processing the circuit board and the interposer module to bond the control board array of pads to the socket contact proximal ends.

17. The method of assembling the interposer module of claim 14 where the signal board further includes a set of retaining pads, each retaining pad proximate to one of the set of pins and retaining the set of pins in place includes soldering each pin of the set of pins to the proximate retaining pad.

18. The method of assembling the interposer module of claim 14 where each of the set of pins is threaded and includes a mating threaded portion and fixing the pin in place includes mating the threaded portion to each pin.

19. The method of assembling the interposer module of claim 14 where retaining the pin in place includes plastically deforming the pin.

20. The method of assembling the interposer module of claim 14 where the ball grid array packaged integrated circuit is configured with one from the set of contact counts of 78 contacts, 86 contacts and 96 contacts.

* * * * *